United States Patent [19]

ten Pierick

[11] Patent Number: 4,536,682

[45] Date of Patent: Aug. 20, 1985

[54] CIRCUIT FOR GENERATING A DEFLECTION CURRENT THROUGH THE FIELD DEFLECTION COIL OF A PICTURE DISPLAY DEVICE

[75] Inventor: Hendrik ten Pierick, Eindhoven, Netherlands

[73] Assignee: U.S. Philips Corporation, New York, N.Y.

[21] Appl. No.: 575,427

[22] Filed: Jan. 31, 1984

[30] Foreign Application Priority Data

Feb. 2, 1983 [NL] Netherlands ............ 8300384

[51] Int. Cl.$^3$ .................. H01J 29/70; H01J 29/72
[52] U.S. Cl. .................................. 315/387; 315/403
[58] Field of Search .............. 315/387, 388, 389, 396, 315/397, 403, 371

[56] References Cited

U.S. PATENT DOCUMENTS

| | | | |
|---|---|---|---|
| 4,147,963 | 4/1979 | Shiotani | 315/387 |
| 4,176,300 | 11/1979 | Waehner | 315/371 |
| 4,289,994 | 9/1981 | Beaumont et al. | 315/389 |

*Primary Examiner*—Theodore M. Blum
*Attorney, Agent, or Firm*—Thomas A. Briody; William J. Streeter; Leroy Eason

[57] ABSTRACT

A circuit for generating a deflection current through the field deflection coil of a picture display device having a sawtooth generator, a combining stage, a multiplying circuit and an amplifier. Applied to the combining stage is a sawtooth signal generated by the sawtooth generator and a sawtooth signal originating from feedback. The combining stage generates three linear combinations of these input signals. Two linear combinations are applied to the multiplying circuit for obtaining a parabolic signal which is applied to a signal input terminal of the amplifier, whereas the third linear combination is applied to the feedback input terminal of the amplifier. The series arrangement of the deflection coil and a separating capacitor is coupled to the output terminal of the amplifier, a feedback network being included between the said series network and the combining stage.

10 Claims, 2 Drawing Figures

CIRCUIT FOR GENERATING A DEFLECTION CURRENT THROUGH THE FIELD DEFLECTION COIL OF A PICTURE DISPLAY DEVICE

BACKGROUND OF THE INVENTION

1. Field of the Invention

The invention relates to a circuit for generating a deflection current through the field deflection coil of a picture display device, comprising a sawtooth generator for applying a sawtooth-shaped signal to an amplifier which has an output terminal to which the series arrangement of the deflection coil and a separating capacitor is coupled and further comprising a feedback network included in a feedback path between the said series arrangement and a feedback input terminal of the amplifier and also means for generating a parabolic signal also for application to the amplifier.

Description of the Prior Art

Such a circuit is disclosed in the German Patent Specification 1,462,870 (PHN 1254). In this known circuit in parabolic component is obtained by integration of the sawtooth component. Thereafter, both components are added together to produce the drive signal for the amplifier The integration has however a known disadvantage: namely the fact that transition phenomena may cause a direct current surge. A further disadvantage is that the capacitor required for the integration cannot be incorporated in a semiconductor body, which increases the number of connecting terminals of this body.

SUMMARY OF THE INVENTION

The invention has for its object to provide a circuit of the above-mentioned type, wherein both the number of capacitors and the number of connecting terminals can be reduced to a minimum. To this end, the circuit according to the invention is characterized in that the said means for generating a parabolic signal comprises a multiplying circuit, the feedback path also comprising a combining stage having a first input terminal connected to the sawtooth generator and a second input terminal connected to the feedback network for applying first and second signals to the multiplying circuit and a third signal to the feedback input terminal of the amplifier, the first, the second as well as the third signals being linear combinations of the signals at the first and at the second input terminal of the combining stage and an output terminal of the multiplying circuit being coupled to a signal input terminal of the amplifier for applying the parabolic signal thereto.

Since the combining stage is included in the feedback path it is achieved that the elements of the loop formed adjust themselves such that signals having the correct variation are generated without coupling capacitors being required between the different portions of the circuit. The only capacitors are then the separating capacitor and capacitors which form part of the sawtooth generator and the feedback network, whereas there are only the following connecting terminals: the connecting terminal of the series arrangement of the deflection coil and the separating capacitor, of the capacitor of the sawtooth generator and of the feedback network. It should be noted that the use of multiplying stages for generating a control signal for the field deflection is known per se, more specifically from German Patent Application 2,236,627.

The combining stage can be constructed in several different manners. Preferably, the circuit according to the invention is characterized in that the combining stage comprises first and second transistors whose emitters are connected to a first and to a second current source, respectively and interconnected by means of a resistance network, while the base of the first transistor is connected to the first input terminal and the base of the second transistor to the second input terminal of the combining stage, the current through the resistance network forming the first signal and the voltage at a collector forming the second signal for application to the multiplying circuit.

In that case the circuit may be characterized in that the voltage at a point of the resistance network is the third signal generated by the combining stage, the said point being connected to the feedback input terminal of the amplifier.

The circuit according to the invention can be advantageously used for two different field frequencies and may be characterized by a second amplifier for producing a deflection current having a second field frequency which deviates from the (first) field frequency of the deflection current produced by the first-mentioned amplifier and having a substantially equal amplitude, the combining stage applying a fourth signal different from the third signal to a feedback input terminal of the second amplifier which fourth signal is a linear combination of the signals at the first and second input terminals of the combining stage, the output terminal of the multiplying circuit being coupled to a signal input terminal of the second amplifier and the output terminal of the first amplifier and the output terminal of the second amplifier being coupled to the series arrangement of the deflection coil and the separating capacitor via an adder stage.

In that case the circuit may be characterized in that a resistor is arranged in series with a current source, one terminal of the resistor being connected to the signal input terminal of the first amplifier and the other terminal to the signal input terminal of the second amplifier for co-determining the d.c. voltage settings of these amplifiers.

The circuit may advantageously be characterized in that the output terminal of the multiplying circuit is connected to a correction circuit for correcting the displayed picture. The parabolic component can thus be utilized in other portions of the picture display device.

The invention will now be described in greater detail by way of example with reference to the accompanying figures.

DESCRIPTION OF THE PREFERRED EMBODIMENTS

Figure 1:
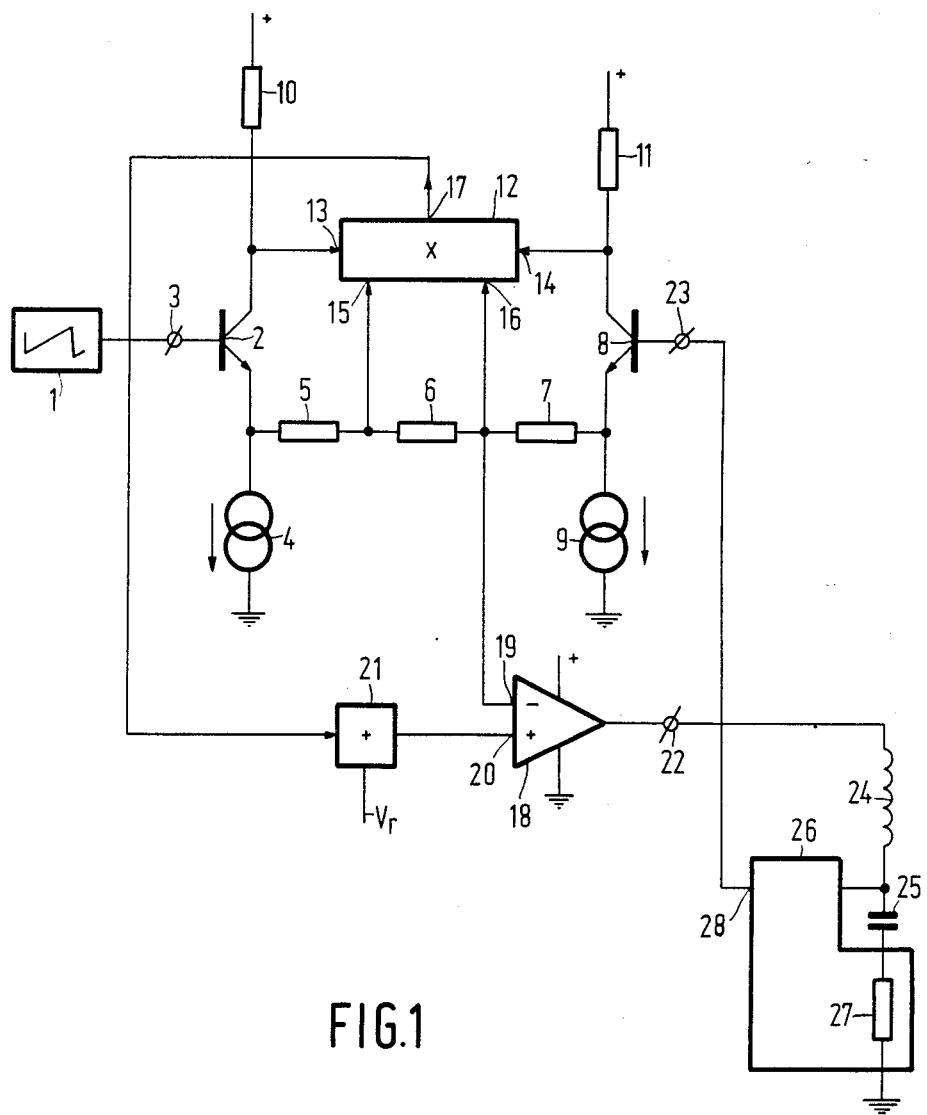
FIG. 1 shows a basic circuit diagram of a field deflection circuit in a picture display device, for example a television receiver.

In the circuit shown in FIG. 1 the signal generated by a sawtooth generator 1 is applied to the base of an npn-transistor 2. Generator 1 is of known structure, for example comprising a capacitor which is charged by a constant current, and is synchronized by received field synchronizing pulses to obtain a sawtooth-shaped voltage having a substantially linear variation during the major part of the period, the so-called trace period. The base of transistor 2 is connected to a terminal 3 of an integrated circuit which comprises transistor 2. The emitter is connected to a current source 4, whose other side is connected to ground, and to the series arrangement of three resistors 5, 6 and 7, whose other side is connected to the emitter of an npn-transistor 8 and to a current source 9, whose other side is connected to ground. The collector of transistor 2 is supplied via a resistor 10 by a positive supply voltage which also supplies the collector of transistor 8, more specifically via a resistor 11.

The circuit shown in FIG. 1 also comprises a multiplying circuit 12 having four inputs 13, 14, 15 and 16 and an output 17. Input 13 is connected to the collector of transistor 2 and input 14 to the collector of transistor 8, whereas input 15 and 16 are each connected to a terminal of resistor 6. The junction between resistors 6 and 7 is also connected to the inverting input 19 of a differential amplifier 18 which is supplied by the same supply voltage and whose non-inverting input 20 is connected to the output of an adder stage 21. An input of stage 21 is connected to the output 17 of circuit 12, while a further input of stage 21 is connected to a reference voltage $V_r$. The output of amplifier 18 is connected to a terminal 22 of the integrated circuit which comprises all the above-described elements with the exception of the capacitor of generator 1, while the base of transistor 8 is connected to a terminal 23. Outside the integrated circuit a field deflection coil 24 is connected to terminal 22, which coil has for its function to deflect the electron beam(s) generated in a picture display tube, not shown, in the vertical direction. The other end of coil 24 is connected to a separating capacitor 25. Both terminals of capacitor 25 are connected to a feedback network 26 which comprises in known manner a plurality of network elements and a terminal of which is connected to ground. Between this terminal and that terminal of capacitor 25 not connected to coil 24 network 26 comprises a measuring resistor 27. The output 28 of network 26 is connected to terminal 23.

In operation the signal at terminal 3 has a field-frequency sawtooth shape which varies in the upward direction during the trace period. Because of the operation of the circuit shown in FIG. 1 and more specifically because of the negative feedback active in the circuit, a sawtooth field deflection current which varies during the trace period in the downward direction flows through coil 24. Network 26 is of such a structure that the voltage present at output 28 also varies in a sawtooth-shaped manner with a decrease during the trace period. So sawtooth-shaped voltages which vary in opposite directions are present at the emitters of transistors 2 and 8. Consequently, a sawtooth current flows through resistors 5, 6 and 7 which current is through transistor 8 subtracted from the current from source 9 and through transistor 2 is added to the current from source 4. In this situation the currents from sources 4 and 9 must be equal if resistors 10 and 11 have the same value. Because of the highest input impedance of amplifier 18 substantially no current flows to input 19 and thanks to the buffering action of transistors 2 and 8 the signals at terminals 3 and 23 are not loaded by the current through resistors 5, 6, 7 and consequently are not distorted.

If the voltage at input 20 does not contain a sawtooth-shaped component, then, at an infinitely high gain of amplifier 18 no sawtooth-shaped signal is present at input 19. At a real, that is to say a non-infinitely high, gain of amplifier 18 there is a difference between the voltage on the two inputs of the amplifier, so that an ascending sawtooth-shape is indeed present at input 19 although with a small amplitude. As the said difference is amplified by amplifier 18, the voltage at terminal 22 also comprises a sawtooth-shaped component, which component, because of the inverting operation of the amplifier, varies in a downward direction. For the low field frequency coil 24 behaves, at least during the trace period, as an ohmic resistance so that the deflection current therethrough and through resistor 27 has indeed a sawtooth-shaped component which varies in a downward direction.

Across capacitor 25, whose capacitance is not infinitely large, the deflection current causes a parabolic voltage having a maximum in the centre of the trace period. So a parabolic component is conveyed to terminal 23 via network 26. If the signal generated by generator 1 does not comprise a parabolic component, then such a component is present without fail at input 19. It will then be obvious that the signal at input 20 must contain a parabolic component. Otherwise, at a high gain of amplifier 18, substantially no parabola could be present at input 19. The parabolic component for input 20 is generated by circuit 12 and added in stage 21 to voltage $V_r$ which provides the d.c. voltage setting of amplifier 18 at terminal 20.

The sawtooth current flowing through resistors 5, 6 and 7 and through transistors 2 and 8 produces voltages at the collectors of these transistors which are applied to circuit 12 via inputs 13 and 14. The same current produces across resistor 6 a voltage drop which is also applied to circuit 12 via inputs 15 and 16. Both the voltage between inputs 13 and 14 and the voltage between inputs 15 and 16 only depend on the said current. So the output signal of circuit 12 is proportional to the square of this current and consequently to the square of the difference between the sawtooth signals at terminals 3 and 23, so it has a parabolic shape. Since input 20 is a non-inverting input this parabola must be of such a shape that the highest value assumed in the centre of the trace period is a maximum.

From the foregoing it is clear that transistors 2 and 8 and resistors 5, 6 and 7 form a combining stage for deriving from the signals at terminals 3 and 23 three signals, namely the voltage across resistor 6 produced by the current flowing through resistors 5, 6 and 7, the difference between the voltages at the collectors of transistors 2 and 8, respectively, and the voltage present at the junction between resistors 6 and 7. Each of those three output signals of the combining stage are linear combinations of fractional proportions of the input signals to the stage, the fractional coefficients of the linear combinations being set by the ratios between the resistance values in the series arrangement 5, 6 7 and consequently varying very little with temperature and tolerances. The parabolic signal obtained by the squaring operation in multiplying circuit 12 is applied to amplifier 18, more specifically to the non-inverting (signal) input terminal 20 thereof, whereas the third output signal of the combining stage is applied to the inverting (feedback) input terminal 19 of the amplifier 18 in the negative feedback sense. As the input signals to the combining stage comprise sawtooth-shaped components it will be obvious that the output signals therefrom also comprise sawtooth-shaped components. It will also be obvious that, for example, a matrix circuit which derives three linear combinations of fractional proportions of two input signals, is suitable to replace the combining stage shown in FIG. 1, as the output signals of such a stage will contain sawtooth-shaped components.

In the circuit described, the first and second linear combinations are proportional to each other, so that a squaring operation takes place in multiplying circuit 12. It will be obvious that this is not necessary and that consequently these combinations may be different. To that end a second circuit can be used which is of a similar structure as the circuit comprising transistors 2 and 8 and associated current sources. It should be noted that the product of the first and second linear combinations also yield components of the third and the fourth power. By using a suitable dimensioning it is however possible to ensure that these components are small and have little affect on the shape of the deflection current obtained, particularly by a symmetrical implementation of circuit 12. It should also be noted that the described symmetrical drive of circuit 12 is not necessary, as the same result can be obtained by applying a sawtooth-shaped component to, for example, input 13 while a d.c. component is present at input 14.

Figure 2:
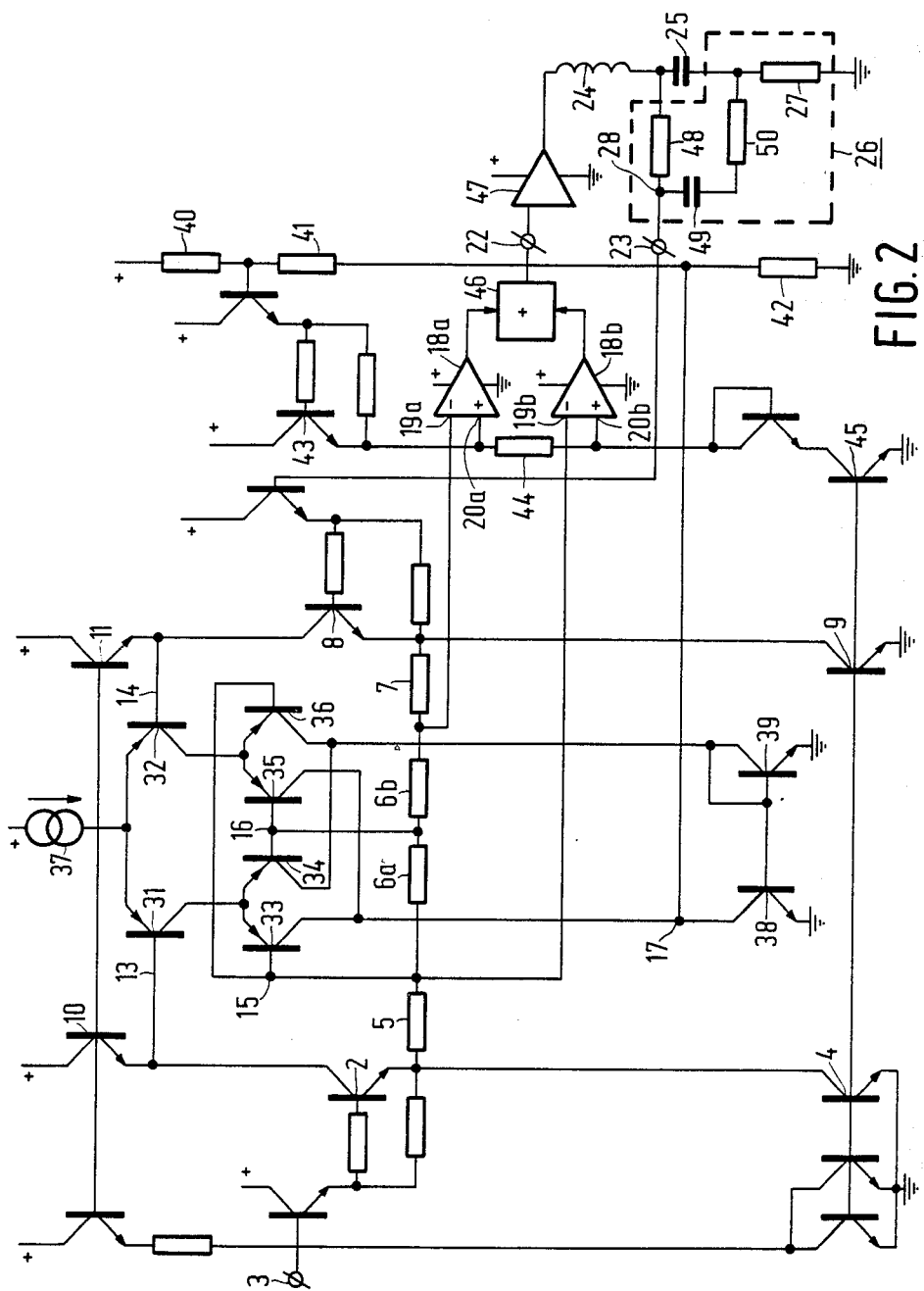
FIG. 2 shows a more detailed circuit diagram of a field deflection circuit suitable for two different field frequencies.

FIG. 2 shows an embodiment of the circuit of FIG. 1 in greater detail. Herein, the components corresponding to those used in FIG. 1 are given the same reference numerals. In FIG. 2 multiplying circuit 12 is constructed in known manner with the aid of 6 pnp transistors 31, 32, 33, 34, 35 and 36. The emitters of transistors 31, and 32 are interconnected and connected to a current source 37, while the bases are connected to the collector of transistors 2 and 8, respectively and form the inputs 13 and 14 of circuit 12.

In FIG. 2 the collector resistors 10 and 11 of transistors 2 and 8 are replaced by npn transistors. The voltage across the base-emitter diode of transistor 10 is proportional to the logarithm of the collector current of transistor 2. In a similar way, the voltage across the base-emitter diode of transistor 11 is proportional to the logarithm of the collector current of transistor 8. As a similar logarithmic relationship occurs between the voltage across the base-emitter diode of transistors 31 and 32, respectively and the collector current thereof, the ratio between the collector currents of transistors 31 and 32 is substantially equal to the ratio between the collector currents of transistors 2 and 8. In this, known, manner an improved linearity is obtained for the input signal between inputs 13 and 14, irrespective of the amount of drive, which assumes that transistors 10 and 11 on the one hand and 31 and 32 on the other hand are identical and have the same temperature characteristic. The same result can be obtained by means of resistors provided in the emitter lead of transistors 31 and 32. The said input signal is proportional to the difference between the collector currents of transistors 2 and 8 and consequently to the current flowing through resistors 5, 6 and 7, this current itself being proportional to the difference between the voltage at terminals 3 and 23.

The collector of transistor 31 is connected to the emitters of transistors 33 and 34 and the collector of transistor 32 is connected to the emitters of transistors 35 and 36. The collectors of transistors 33 and 35 are interconnected and connected to the collector of an npn-transistor 38, while the collectors of transistors 34 and 36 are interconnected and connected to the collector of an npn-transistor 39. The base of transistor 38 is connected to the base and to the collector of transistor 39, whereas both emitters are connected to ground.

Resistor 6 is divided into two series-arranged resistors 6a and 6b. The junction between resistors 5 and 6a is connected to the bases of transistors 33 and 36, forming input 15, while the junction between resistors 6a and 6b is connected to the bases of transistors 34 and 35, forming input 16. So, in operation the voltage present across resistor 6a is applied to multiplier as a differential signal between the bases of transistors 33 and 34 on the one hand and between the bases of transistors 35 and 36 on the other hand, as a result of which multiplication by the signal formed from the difference between the collector currents of transistors 31 and 32 if effected. Because of the symmetrical circuit configuration the collector currents of transistors 38 and 39 are substantially equal. The current through a conductor connected to the collector of transistor 38 is consequently equal to the difference between the sum of the collector currents of transistors 33 and 35 on the one hand and the sum of the collector currents of transistors 34 and 36 on the other hand. This current is the output signal of the multiplier and the collector of transistor 38 forms the output 17 thereof. The symmetrical construction of the amplifier ensures that the output current thereof is substantially zero in the centre of the trace period when the input voltages are zero. As a result thereof the currents within the multiplier are very small so that the influence of deviation errors on the deflection current is very low. Because of the current-mirror operation with the aid of transistors 38 and 39 and because of the symmetrical construction it is furthermore obtained that the output signal of the multiplier, as desired, comprises substantially no sawtooth-shaped and substantially no third power components.

The above-mentioned conductor is connected to the junction between two resistors 41 and 42. The other side of resistor 42 is connected to ground, while the other side of resistor 41 is connected to a resistor 40. The further terminal of resistor 40 is connected to the supply voltage. The voltage at the junction between resistors 40 and 41 determines the voltage at the emitter of a buffer transistor 43 and at the non-inverting input terminal 20a, connected to the buffer transistor, of a differential amplifier 18a, and also the voltage at the non-inverting terminal 20b of an amplifier 18b. A resistor 44 is arranged between terminals 20a and 20b and a current source 45 is included between terminal 20b and ground. The collector of transistor 43 is connected to the supply voltage. The inverting input terminal 19a of amplifier 18a is connected to the junction between resistors 6b and 7, whereas the inverting input terminal 19b of amplifier 18b is connected to the junction between resistors 5 and 6a. The output terminals of amplifiers 18a and 18b are each connected to an input of an adder stage 46 whose output, is connected to terminal 22, optionally via a non-inverting amplifier 47.

The circuit of FIG. 2 is designed for use in a television receiver suitable for both a 50 Hz field frequency (European standard) and a 60 Hz field frequency (U.S. standard). For both frequencies sawtooth generator 1 generates a signal which has a free-running frequency of approximately 46 Hz, that is to say lower than the lowest field frequency, and which is synchronized in known manner to the received synchronizing signal. In these circumstances the synchronized sawtooth at terminal 3 has a smaller amplitude for 60 Hz than for 50 Hz, namely by a factor 50/60. As it is desirable for the deflection current to have substantially the same amplitude for both field frequencies, the gain is changed-over in the present circuit, and that to a higher value for 60 Hz than for 50 Hz. In addition, as the parabolic voltage across capacitor 25 is lower for 60 Hz than for 50 Hz, the parabolic component generated by the multiplier circut must also be less for 60 Hz than for 50 Hz. Amplifier 18a has for its function to amplify the 50 Hz signal, whereas amplifier 18b has for its function to amplify the 60 Hz signal. Always one of these amplifiers is made operative by means of a change-over feature, not shown for simplicity of the drawing whereas the other amplifier remains idle. As the input signal applied between inputs 15 and 16 to the multiplier is not subjected to a linearity correction, in contrast to the input signal between inputs 13 and 14, as a result of which a different ratio is obtained between these two components at a smaller amplitude, and by a suitable dimensioning of a circuit, particularly by the choice of the values of resistors 5, 6a, 6b, 7, 40, 41, 42 and 44, it is ensured that both the d.c. voltage settings and the amplitudes of the sawtooth and the parabolic components at the input terminals of amplifiers 18a and 18b have the correct value, the parabolas being symmetrical relative to the maximum values thereof. It will be obvious that when one field frequency is used the linearity can be corrected for both input signals of the amplifier. The amplified signal is transmitted via stage 46. If necessary, a power gain is effected by means of amplifier 47, which is located outside the integrated circuit, for converting the output voltage of amplifier 18a and 18b, respectively into a current. In known manner the circuit may comprise a flyback generator for increasing the supply voltage of amplifier 47 during the retract period.

The deflection current must furthermore comprise a third power component for the so-called S-correction. Such a component can be generated by multiplying a parabola-shaped component by a sawtooth-shaped component. In the circuit of FIG. 2 the S-component is generated by means of negative feedback network 26. In parallel with capacitor 25 there is the series arrangement of a resistor 48, a capacitor 49 and a resistor 50. A current which is approximately parabolic and produces a third power voltage across capacitor 49 flows through resistors 48 and 50. The junction 28 between resistor 48 and capacitor 49 is connected to terminal 23. As the circuit of FIG. 2 does not generate a third power component, such a component is not present on terminal 23. Such a component is indeed present at the junction between resistors 27 and 25 and has a polarity which is opposite to the third power voltage across capacitor 49, causing the deflection current flowing through resistor 27 to contain the desired third power component with the proper polarity. In known manner, resistor 50 is provided for suppressing very low-frequency oscillations. It will be obvious that network 26 can be constructed in a different, known manner to obtain a deflection current having a predetermined variation.

The field-frequency parabolic voltage at point 17 can be utilized in other places in the picture display device, of which the circuit of FIG. 2 forms part. For this purpose this voltage can be applied to a line deflection circuit for modulating the amplitude of the line deflection current in known manner, which is the so-called east-west raster correction and/or to a circuit for generating the focusing voltage for an electrode of the picture display tube, i.e. the so-called dynamic focusing correction.

I claim:

1. In a circuit for generating a deflection current through the field deflection coil of a picture display device, comprising an amplifier and a sawtooth generator for supplying a sawtooth-shaped signal to the amplifier, said amplifier having an output terminal to which a series arrangement of the deflection coil and a separating capacitor is coupled, and further comprising a feedback network included in a feedback path arranged between the said series arrangement and a feedback input terminal of the amplifier, and also means for deriving from the sawtooth-shaped signal a parabolic signal for application to a signal input terminal of the amplifier, the improvement wherein the means for generating a parabolic signal comprises a multiplying circuit and the feedback path also comprises a combining stage having a first input terminal connected to the sawtooth generator and a second input terminal connected to the feedback network, said combining stage being adapted to apply first and second signals to the multiplying circuit and a third signal to the feedbck input terminal of the amplifier; the first, second and third signals being derived by the combining stage by linear combinations of fractional proporations of the signals at the first and second input terminals thereof, and an output terminal of the multiplying circuit being coupled to the signal input terminal of the amplifier for applying the parabolic signal thereto.

2. A circuit as claimed in claim 1 wherein the combining stage comprises first and second transistors whose emitters are connected to a first and to a second current source, respectively, and interconnected by a resistance network, the base of the first transistor being connected to the first input terminal and the base of the second transistor to the second input terminal of the combining stage, the current through the resistance network producing the first signal and the voltages at the collectors of said transistors producing the second signal for application to the multiplying circuit.

3. A circuit as claimed in claim 2 wherein the multiplying circuit is of symmetrical configuration and the voltage across a resistor of the resistance network constitutes the first signal and the differential voltage between the collector of the first transistor and the collector of the second transistor constitutes the second signal for application to the multiplying circuit.

4. A circuit as claimed in claim 3 wherein the multiplying circuit comprises a first and a second differential amplifier, each differential amplifier comprising a first and a second transistor having interconnected emitters, the interconnected emitters of the transistors of said first and second differential amplifiers being respectively connected to the collectors of third and fourth transistors, said third and fourth transistors forming a third differential amplifier in which the emitters thereof are interconnected and the bases thereof are respectively connected to the collectors of the first and second transistors of the combining stage, the base of the first transistor of the first differential amplifier being connected to the base of the second transistor of the second differential amplifier and to a terminal of the said resistor of the resistance network, while the base of the second transistor of the first differential amplifier is connected to the base of the first transistor of the second differential amplifier and to the other terminal of the resistor, the collector of the first transistor of the first differential amplifier being connected to the first transistor of the second differential amplifier and the collector of the second transistor of the first differential amplifier being connected to the collector of the second transistor of the second differential amplifier, the connections thus formed being symmetrical and one of such connections forming the output terminal of the multiplying circuit.

5. A circuit as claimed in claim 1, wherein the output terminal of the multiplying circuit is connected to a tap of a voltage divider which determines the d.c. voltage setting at the signal input terminal of the amplifier.

6. A circuit as claimed in claim 2, wherein the voltage at a point of the resistance network is the third signal generated by the combining stage, the said point being connected to the feedback input terminal of the amplifier.

7. A circuit as claimed in claim 1 further comprising a second amplifier for producing a deflection current having a field frequency which deviates from the field frequency of the deflection current produced by the first mentioned amplifier and having a substantially equal amplitude, the combining stage applying a fourth signal different from the third signal to a feedback input terminal of the second amplifier which fourth signal is a linear combination of fractional proportions of the signals at the first and the second input terminals of the combining stage, the output terminal of the multiplying circuit being coupled to a signal input terminal of the second amplifier and the output terminal of the first amplifier and the output terminal of the second amplifier being coupled to the series arrangement of the deflection coil and the separating capacitor via an adder stage.

8. A circuit as claimed in claim 3 wherein the linearity of the second signal applied to the multiplying circuit by the combining stage is corrected and the linearity of the first signal applied to the multiplying circuit by the combining stage is not corrected.

9. A circuit as claimed in claim 7 further comprising a resistor connected in series with a current source, one terminal of the resistor being connected to the signal input terminal of the first amplifier and the other terminal of the resistor being connected to the signal input terminal of the second amplifier for co-determining the d.c. voltage settings of both amplifiers.

10. A circuit as claimed in claim 1 wherein the output terminal of the multiplying circuit is connected to a circuit for correcting the operation of the picture display device.

* * * * *